United States Patent [19]

Hirose

[11] Patent Number: 5,045,696
[45] Date of Patent: Sep. 3, 1991

[54] PHOTOELECTRON MICROSCOPE

[75] Inventor: Hideo Hirose, Otsushi, Japan

[73] Assignee: Shimadzu Corporation, Kyoto, Japan

[21] Appl. No.: 494,443

[22] Filed: Mar. 16, 1990

[30] Foreign Application Priority Data

Mar. 31, 1989 [JP] Japan .................................. 1-82462
Aug. 25, 1989 [JP] Japan .................................. 1-219473

[51] Int. Cl.⁵ ........................ H01J 40/00; H01J 40/12
[52] U.S. Cl. .............................. 250/306; 250/423 P; 378/43
[58] Field of Search .................... 250/306, 423 P, 305; 378/43

[56] References Cited

U.S. PATENT DOCUMENTS

| 4,255,661 | 3/1981 | Liebl | 250/396 R |
| 4,486,659 | 12/1984 | Turner | 250/306 |
| 4,829,177 | 5/1989 | Hirsch | 250/306 |
| 4,912,737 | 3/1990 | Ohsuka et al. | 378/43 |

Primary Examiner—Bruce C. Anderson
Attorney, Agent, or Firm—Fidelman & Wolffe

[57] ABSTRACT

A photoelectron microscope wherein a normal conductive coil is used to produce a divergent magnetic field to form an enlarged photoelectron image of a specimen to be examined. The coil is only momentarily energized by pulse current, and in synchronism with the energization of the coil and while the change of the resultant magnetic field with time is small, the radiation source is actuated to produce a radiation pulse so that the photoelectrons produced upon irradiation of a specimen with the pulse flies through the magnetic field so as to be received by an image forming device. The image forming device is operated in synchronism with and a predetermined variable period of time after the actuation of the radiation source thereby to obtain photoelectron images of the specimen of different energy levels. By skimming only those photoelectrons of low energy which are emitted close to the axis of the magnetic field, it is possible to obtain images of high resolution.

19 Claims, 5 Drawing Sheets

1ST CONTROL SIGNAL

DISCHARGE CURRENT

2ND CONTROL SIGNAL

X-RAY PULSE

3RD CONTROL SIGNAL

PHOTOELECTRON MICROSCOPE

BACKGROUND OF THE INVENTION

This invention relates to a photoelectron microscope such as an X-ray microscope or the like wherein a specimen is irradiated with X rays, or ultraviolet or synchrotron radiation, so that the specimen or a photocathode disposed in close proximity of the specimen emits photoelectrons by means of which an image of the specimen is formed.

The X-ray microscope of the type with which the invention is concerned uses an X-ray source such as a conventional X-ray tube which continuously emits X rays, and a focusing coil for forming an enlarged photoelectron image of the specimen.

With a continuous radiation source it is impossible to make a real-time measurement or obtain images of high resolution.

The photoelectrons emitted by the specimen irradiated with X rays or a photocathode disposed in contact therewith have different energy levels, and in order to obtain photoelectron images at different energy levels, a meshed energy filter is arranged adjacent to the image plane of the enlarged photoelectron image, with resulting complication of the structure of the microscope and reduction of the transmittance of photoelectrons and consequent darkening of the images obtained.

With a focusing coil for forming an enlarged photoelectron image of a specimen it is difficult to obtain a good image due to an astigmatic aberration caused by different energy levels of the photoelectrons and a spherical aberration caused by different emission angles thereof. To reduce the aberrations it is necessary to use an aperture stop or a correction lens, with resulting reduction in the efficiency of using the photoelectrons and darkening of the image obtained.

To avoid such undesirable results, it has been proposed to use a superconductive coil to obtain a strong divergent magnetic field in which the emitted photoelectrons advance along the flux lines to form an enlarged image of the object under observation (cf. Nature, Vol. 290, Apr. 16, 1981, pp 556~559). To make a superconductive coil operate, however, liquid helium and equipment therefor are required, so that the whole apparatus becomes complicated and large in size and cannot be made readily available for general use.

Accordingly, it is one object of the invention to provide a photoelectron microscope such as an X-ray microscope or the like which employs a radiation source so designed as to produce radiation pulses within a predetermined short wavelength range including X rays and ultraviolet rays to irradiate a specimen to be analyzed, and a normal conductive coil for producing a divergent magnetic field, with means for energizing the coil in synchronism with the radiation pulses.

Another object of the invention is to provide such a photoelectron microscope as mentioned above which uses neither a superconductive coil for producing a divergent magnetic field nor a meshed energy filter in order to obtain photoelectron images of different energy levels.

SUMMARY OF THE INVENTION

In one form of the invention a normal conductive coil is used to produce a divergent magnetic field to form an enlarged photoelectron image of a specimen to be observed. The coil is energized by pulse current, and in synchronism with the energization of the coil and while the change of the resultant magnetic field with time is small, the radiation source is actuated to produce a radiation pulse so that the photoelectrons emitted upon irradiation of a specimen with the pulse flies through the magnetic field so as to be received by an image forming device.

In another form of the invention the image forming device is operated in synchronism with and a predetermined variable period of time after the actuation of the radiation source, so that it is possible to obtain images of different energy levels.

The radiation source is capable of producing radiation pulses having a width of several nanoseconds and a wavelength within a short wavelength range including X rays and ultraviolet rays. Since the radiation is emitted in the form of pulses, it is possible to reduce the average energy level of the radiation produced for analysis of a specimen and yet produce a strong radiation. Since the specimen is irradiated with radiation pulses, the photoelectrons emitted by the specimen or a photocathode provided close to the specimen are also in the form of pulses. By detecting the photoelectrons in synchronism with and a predetermined variable period of time after the radiation emission from the source, or by changing the time between the emission of the radiation from the source and the actuation of the photoelectron image forming device, it is possible to separate the photoelectrons according to their flying times and analyze the energy of the photoelectrons without using a meshed energy filter and loss of the photoelectrons thereby to obtain a bright image. It is also possible to obtain images of high resolution by skimming only those photoelectrons which have low kinetic energies, e.g. below 1 eV and which have been emitted close to the axis of the magnetic field.

The microscope of the invention uses a divergent electromagnetic field to obtain an enlarged photoelectron image, the resolution of which is proportional to the magnetic field strength. To attain a high degree of resolution, a high magnetic field strength is required, and in the prior art a superconductive coil was employed to provide a magnetic field of a required strength. The microscope of the invention, however, employs a normal conductive coil which is energized by pulse current, so that it is possible to provide a magnetic field of a sufficient strength by momentarily supplying a large current to the coil while reducing the average current to a low level.

PREFERRED EMBODIMENTS OF THE INVENTION

Figure 1:
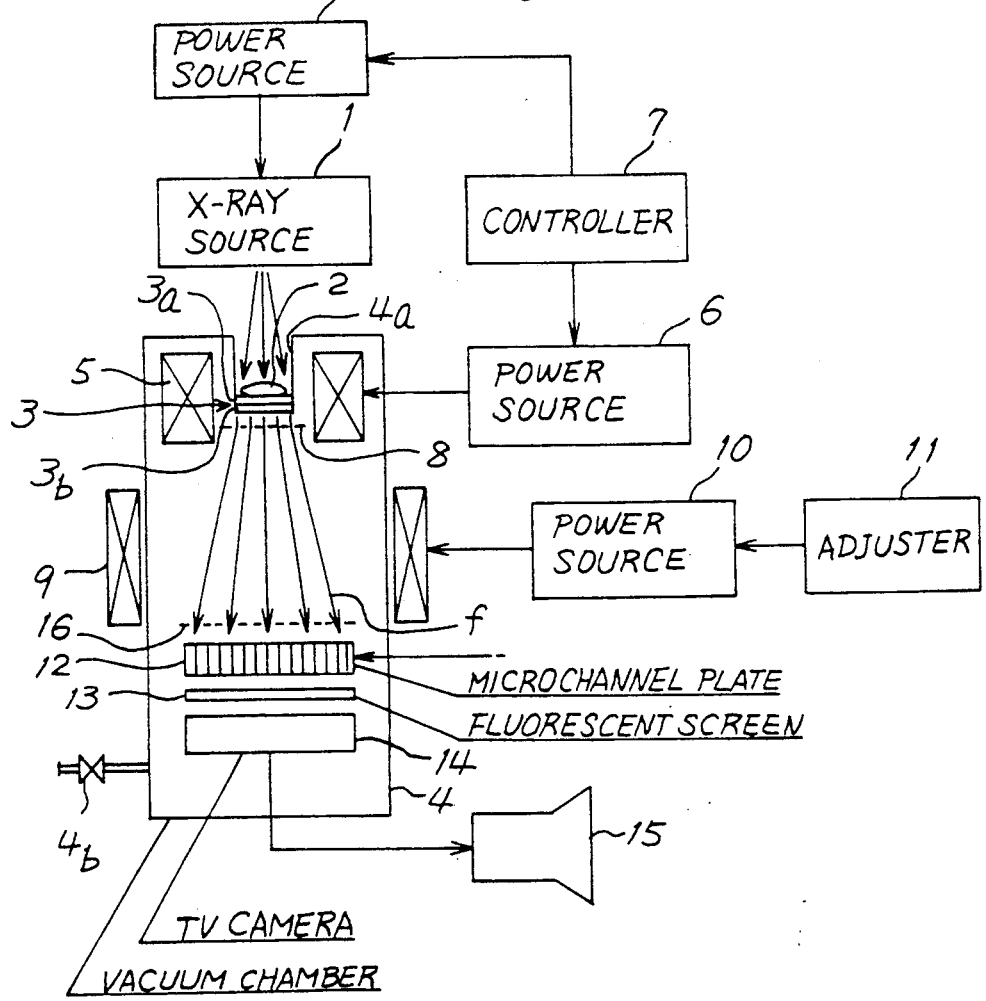
FIG. 1 schematically shows one embodiment of the invention.

Referring to FIG. 1, there is shown a radiation source 1 such as, for example, a laser plasma or pinch plasma X-ray source, which produces high-energy X-ray pulses. The source can also be a synchrotron capable of producing synchrotron radiation pulses. A specimen 2 to be analyzed is held by a specimen holder 3, which comprises a support layer 3a, on the upper surface of which is the specimen 2 in close contact therewith, and a photocathode layer 3b attached to the opposite surface of the support layer 3a. The support layer 3a can be a membrane made of $Si_3N_4$ and having a thickness of the order of 1000 Å, and the photocathode 3b can be made of CsI. A power source 22 is so actuated as to cause the X-ray source 1 to produce X-ray pulses having a width of, say, 1 to 10 nanoseconds at, say, 10 Hz.

When the specimen 2 is irradiated with an X-ray pulse, the radiation transmitted through the specimen causes the photocathode 3b to emit photoelectrons in an amount proportional to that of the incident X rays. From that surface of the photocathode 3b (the under surface thereof as viewed in the figure) which is opposite to that surface thereof to which the specimen 2 is attached, photoelectrons are emitted into a vacuum chamber 4 made of an electrical insulator such as ceramic material and evacuated through a valve 4b in a well-known manner. The chamber 4 is provided at one end thereof with a recessed portion 4a, the bottom wall of which has a window composed of the above-mentioned specimen holder 3, with the specimen 2 being exposed outside the vacuum chamber 4 and the photocathode 3b disposed in the vacuum chamber 4. A main electromagnetic coil 5 is so arranged in the vacuum chamber 4 as to encircle the specimen holder 3.

A power source 6 supplies a pulse-like current to the main coil 5, whereupon the coil 5 produces a divergent magnetic field as schematically shown by flux lines f. A controller 7 controls the power source 22 and the power source 6 synchronously in such a manner that while the main coil 5 produces a divergent magnetic field, the X-ray source 1 produces an X-ray pulse to irradiate the specimen 2. The photoelectrons emitted by the photocathode 3b pass through a gird 8 disposed in front of the photocathode 3b and having a negative potential with respect to the specimen holder 3, and move forward in the divergent magenetic field schematically shown by flux lines f.

A subsidiary coil 9 is provided to correct the divergent magnetic field produced by the main coil 5. The coil 9 is energized by a power source 10. An adjuster 11 adjusts the amount of current to be supplied to the coil 9 thereby to change the magnetic field strength and consequently the magnification of the image obtained as will be described later in detail.

Provided in the vacuum chamber 4 adjacent the other end thereof is a microchannel plate 12 and a fluorescent screen 13. The microchannel plate 12 forms an enlarged photoelectron image of the specimen and intensifies the image, which is rendered visible by the screen 13. A camera 14 using a charge-coupled image sensor takes the visible image on the screen 18 and displays the image on a cathode-ray tube 15.

The photoelectrons which have been emitted by the photocathode 3b and passed through the grid 8 fly along the flux lines f of the diverging magnetic field produced by the main coil 5 while describing a helix and reach the microchannel plate 12, where the photoelectrons are amplified and form on the screen 13 a visible image which is a magnified image of the specimen 2 formed by the X rays that have passed through the specimen.

A grid 16 may be provided in front of the microchannel plate 12 for energy analysis of the photoelectrons.

Figure 2:
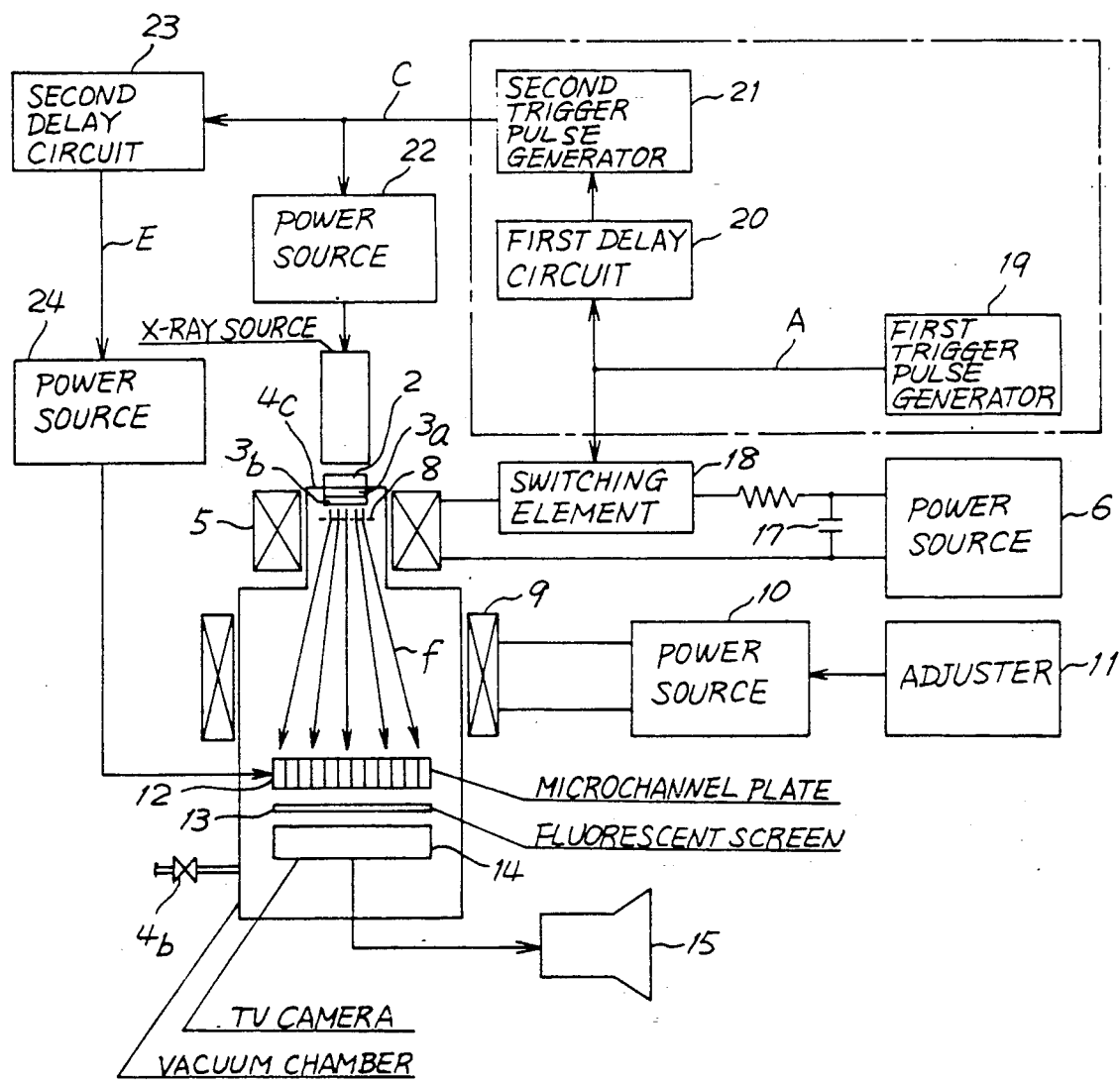
FIG. 2 schematically shows another embodiment of the invention.
Figure 3A:
FIG. 3 is a waveform diagram for explanation of the operation of the microscope shown in FIG. 2.
Figure 3B:
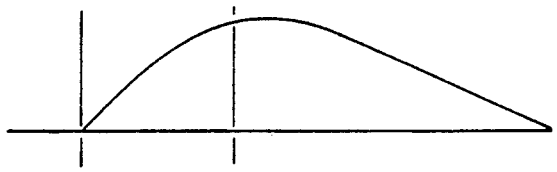
Figure 3C:
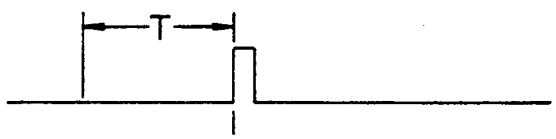
Figure 3D:
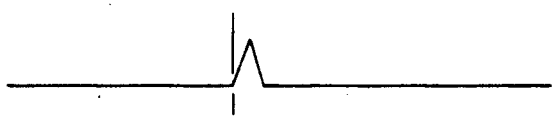
Figure 3E:
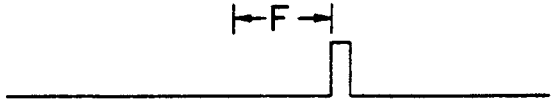

FIG. 2 shows a second embodiment of the invention. In FIG. 2 the same reference numerals as in FIG. 1 designate corresponding component parts so that no explanation will be given to them except when necessary.

The vacuum chamber 4 has one end portion 4c reduced in diameter. In the end wall of the reduced-diameter portion 4c of the chamber 4 there is fitted a specimen holder 3 comprising a support layer 3a, on the outer surface of which a specimen 2 is held, and to the inner surface of which a photocathode 3b is fixed.

About the reduced-diameter portion 4c of the vacuum chamber 4 there is provided a main coil 5 for producing a divergent magnetic field. A power source 6 charges a capacitor 17 having a large capacity. The coil 5 is connected in the discharge circuit of the capacitor 17, and a switching element 18 is connected in series with the coil 5. When the switching element 18 receives a trigger pulse (to be referred to as the first control signal) from a first trigger pulse generator 19. the switching element 18 is rendered conducting, whereupon a pulse-like discharge current from the capacitor 17 energizes the coil 5. The pulse width of the discharge current may be of the order of 100 μs.

The first control signal from the first trigger pulse generator 19 is also applied through a first delay circuit 20 to a second trigger pulse generator 21. which produces a second trigger pulse (to be referred to as the second control signal) having a pulse width of several nanoseconds. A power source 22 is momentarily actuated by the second control signal from the second trigger pulse generator 21 to emit an X-ray pulse having a width of several nanoseconds.

The second control signal from the second trigger pulse generator 21 is also applied to a second delay circuit 23, which produces a pulse (to be referred to as the third control signal) having a width of several nanoseconds. The third control signal is applied to a power source 24, which actuates the microchannel plate 12 a period of time F after emission of the X-ray pulse by the X-ray source.

FIG. 3 shows a time chart for explaining the operation of the apparatus shown in FIG. 2. The output pulse (the first control signal) produced by the first trigger pulse generator 19 is shown at A, and the discharge current caused by the signal A to flow through the coil 5 is shown at B. The width of the discharge current is of the order of 100 μs. In the drawing the pulse shape is not shown proportional with respect to time for easiness of illustration.

The output pulse (the second control signal) from the second trigger pulse generator 21 is shown at C and delayed a period of time T after the leading edge of the first control signal A. The time T is variable and adjusted to the time from the leading edge of the pulse A to a point immediately before the discharge current energizing the coil 5 reaches a peak value. The X-ray pulse emitted by the X-ray source 1 is shown at D having a width of several nanoseconds.

The output pulse (the third control signal) produced by the second delay circuit 23 a period of time F after the leading edge of the second control signal C is shown at E. The third control signal E has a pulse width of several nanoseconds, during which time the microchannel plate 12 is operated to detect only those of the photoelectrons emitted by the photocathode 3b for which it has taken the time F to reach the microchannel plate 12. By changing the time F it is possible to separate the photoelectrons according to their velocities or energy levels.

The image sensor 14 stores the image on the fluorescent screen 13, and the stored image is read out to be displayed on the cathode-ray tube 15.

In case the X-ray source has a high peak value such as a plasma X-ray source, a single X-ray pulse suffices to obtain a good image and enable real-time observation. If a conventional X-ray tube which produces a relatively week X-ray pulse is used, however, several X-ray pulses are required.

Figure 4:
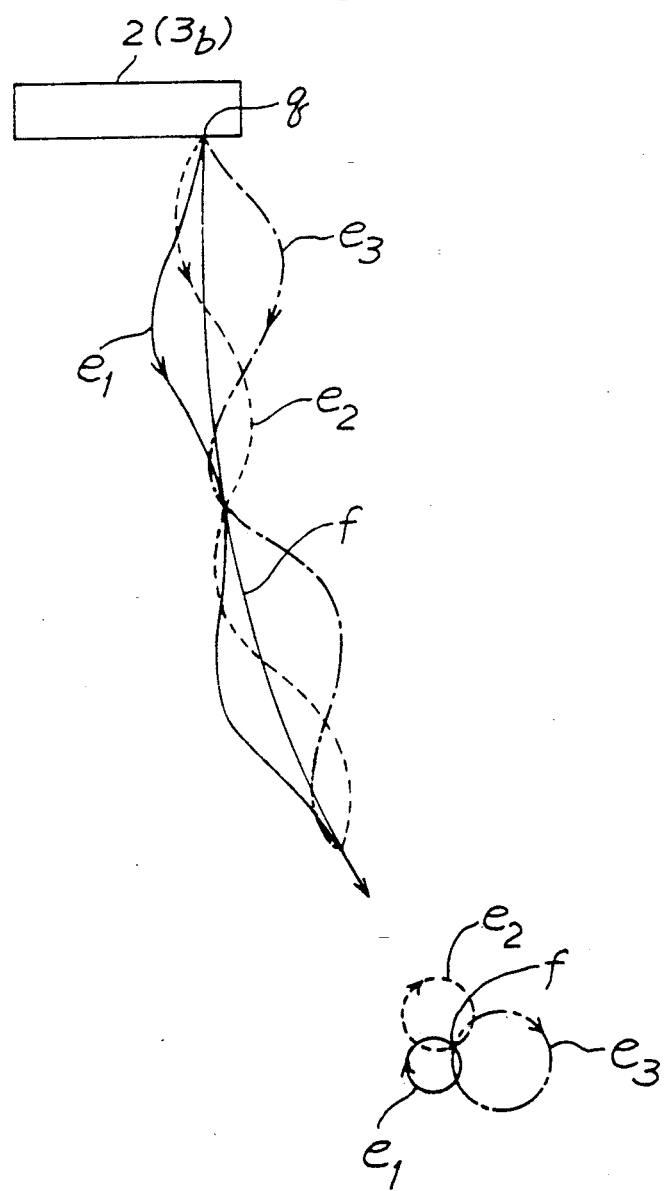
FIG. 4 schematically shows the relation between a magnetic flux line and the trajectories of photoelectrons.

FIG. 4 schematically shows the motion of photoelectrons relative to a flux line in the magnetic field provided by the coil 5. Those photoelectrons which have emerged at a point q on a specimen 2 or a photocathode 3b at different angles advance along a flux line f passing through the point q while describing helical trajectories thereabout, three of which are shown by way of example at $e_1$, $e_2$ and $e_3$. In particular, provided that the strength of the magnetic field adjacent the flux line f can be considered to be equal to the strength of the magnetic field along the flux line, that is to say, the change of the magnetic field in the plane perpendicular to the flux line is small, a photoelectron emerging from the point q traces a helical trajectory $e_1$, $e_2$ or $e_3$ and repeatedly returns to the flux line f with the the same cycle while advancing a distance corresponding to the velocity component of the electron parallel to the flux line f regardless of the velocity component thereof normal to the flux line. The diameter of the trajectory projected as a circle on a plane normal to the flux line determines the resolution of the image formed, and the radius of the circle is in direct proportion to the electron energy and in inverse proportion to the magnetic field strength provided that the velocity component of the electron normal to the magnetic field is the same. Therefore, the resolution is determined by the electron energy and magnetic field strength. Let the magnetic field strength (flux density) be B, the mass of an electron be m, the charge of the electron be e, the angle between the direction of the emitted electron and the normal to the surface of the photocathode be $\theta$ and the energy of the electron be E, the resolution r is proportional to $\sqrt{2mE} \sin\theta/eB$. If $B=10T$, $\theta=25°$ and $E\leq 0.5$ eV, $r\approx 0.1$ µm.

The coil 5 is energized by a pulse current having a width of the order of 100 µs, so that eddy current will be induced in the adjacent members made of conductive material and the magnetic field induced by the eddy current will disturb the magnetic field induced by the coil 5 thereby to distort the image formed. Therefore, the vacuum chamber 4 is made of insulating material such as ceramic material, and the interior wall surface of the chamber is coated with a thin conductive film so as to prevent the wall from being charged up due to collision of electrons against the wall. The conductive film on the inner wall surface of the vacuum chamber is as thin as less than 1000 Å so as to make the influence of eddy current negligible.

Since the magnification M is given by $$M = \sqrt{Bi/Bf}$$

wherein Bi is the magnetic field strength on the photocathode 3b and Bf is the magnetic field strength adjacent the detector, the magnification M can be changed by changing Bf. To change Bf the microchannel plate 12, the fluorescent screen 13 and the camera 14 as an integral unit may be displaced relative to the photocathode 3b within the vacuum chamber 4 thereby to change the magnification M continuously. Also, by changing the strength of the field provided by the correction coil 9 by operating the adjuster 11 it is possible to change Bf thereby to change the magnification M.

Figure 5:
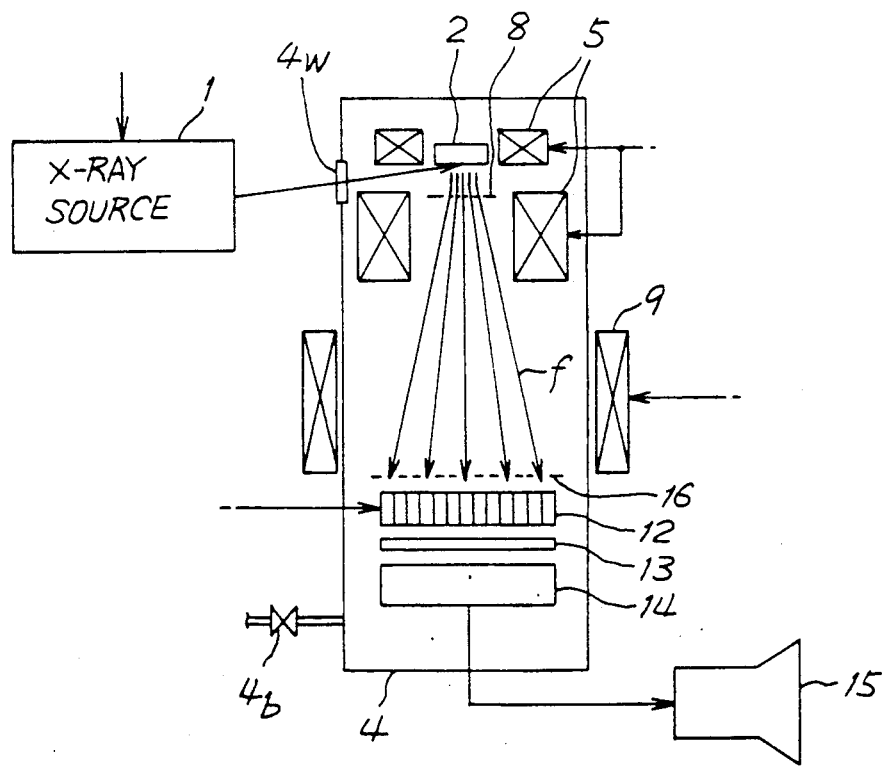
FIG. 5 schematically shows a third embodiment of the invention.

FIG. 5 shows a third embodiment of the invention, wherein a specimen 2 to be examined is enclosed in a vacuum chamber 4 provided with a window 4w, through which an X-ray source 1 projects X rays onto the specimen. The same reference numerals or symbols as in FIGS. 1 or 2 designate corresponding component elements so that no explanation will be necessary.

In accordance with the invention, both the X-ray source and the coil are actuated only momentarily, that is, for a fraction of time, so that without using a superconductive coil or large complicated equipment it is possible to provide strong X rays and obtain bright images, and also to provide a strong magnetic field thereby to attain a high resolution of the image obtained. Since the X-ray source is actuated only momentarily, it is possible to analyze the energy of the photoelectrons emitted by a specimen or a photocathode in contact therewith according to the flying times of the photoelectrons thereby to obtain different images of a specimen according to different energy levels of the X-ray photoelectrons without reducing the efficiency of utilizing the photoelectrons, and to make real-time observation of an X-ray microscopic image of the tissue and/or spatial distribution of the component elements of a specimen. It is also possible to obtain images of improved spatial resolution by skimming only those electrons of lower energy than 1 eV which have been emitted in a direction perpendicular to the photocathode, or close to the axis of the magnetic field.

What I claim is:

1. A photoelectron microscope comprising:
    a) a specimen holder for holding a specimen to be observed;
    b) an electromagnetic radiation source for producing an electromagnetic radiation within a predetermined short wavelength range;
    c) a normal conductive coil arranged adjacent to said specimen holder;
    d) a first power source connected to said coil;
    e) a second power source connected to said connected to said electromagnetic radiation source;
    f) a chamber for defining an evacuated space;
    g) a controller for producing a first signal to cause said first power source to energize said coil for a predetermined short period of time to produce a divergent magenetic field in said evacuated space and, in synchronism with said first signal, a second signal to cause said second power source to actuate said electromagnetic radiation source to emit an electromagnetic radiation pulse, which irradiates said specimen to emit photoelectrons in said evacuated space;
    h) photoelectron image forming means disposed in said evacuated space for receiving said photoelectrons to form a photoelectron image of said specimen; and
    i) image converting means for converting said photoelectron image to a visible image.

2. The apparatus of claim 1, wherein said electromagnetic radiation consists of X rays.

3. The apparatus of claim 1, wherein said electromagnetic radiation consists of ultraviolet rays.

4. The apparatus of claim 1, wherein said electromagnetic radiation consists of synchrotron radiation.

5. The apparatus of claim 1, wherein said specimen holder comprises a support layer on one surface of which said specimen is held in contact therewith and a photocathode in contact with the opposite surface of said support layer, and wherein said chamber is provided with a window which is composed of said specimen holder, with said specimen exposed outside chamber and said photocathode disposed inside said chamber.

6. The apparatus of claim 1, wherein said photoelectron image forming means comprises a microchannel plate and said image converting means comprises a TV camera and a cathode-ray tube.

7. The apparatus of claim 1, further including:
   j) a subsidiary coil for correcting said divergent magnetic field produced by said normal conductive coil;
   k) a third power source for energizing said subsidiary coil; and
   l) means for adjusting said third power source to change the strength of said divergent magnetic field thereby to change the magnification of said image.

8. The apparatus of claim 1, wherein the position of said photoelectron image forming means and said image converting means as a unit is variable relative to said specimen holder thereby to change the magnification of said image.

9. The apparatus of claim 1, further including:
   m) means operable in synchronism with and a predetermined period of time after said second signal to operate said photoelectron image forming means.

10. The apparatus of claim 9, wherein said predetermined period of time is variable so that photoelectron images of said specimen can be formed by photoelectrons of different energy levels.

11. The apparatus of claim 9, wherein said electromagnetic radiation consists of X rays.

12. The apparatus of claim 9, wherein said electromagnetic radiation consists of ultraviolet rays.

13. The apparatus of claim 9, wherein said electromagnetic radiation consists of synchrotron radiation.

14. The apparatus of claim 9, wherein said specimen holder comprises a support layer on one surface of which said specimen is held in contact therewith and a photocathode in contact with the opposite surface of said support layer, and wherein said chamber is provided with a window which is composed of said specimen holder, with said specimen exposed outside said chamber and said photocathode disposed inside said chamber.

15. The apparatus of claim 9, wherein said photoelectron image forming means comprises a microchannel plate and said image converting means comprises a TV camera and a cathode-ray tube.

16. The apparatus of claim 9, further including:
   j) a subsidiary coil for correcting said divergent magnetic field produced by said normal conductive coil;
   k) a third power source for energizing said subsidiary coil; and
   l) means for adjusting said third power source to change the strength of said divergent magnetic field thereby to change the magnification of said image.

17. The apparatus of claim 9, wherein the position of said photoelectron image forming means and said image converting means as a unit is variable relative to said specimen holder thereby to change the magnification of said image.

18. the apparatus of claim 9, wherein said specimen holder is enclosed in said chamber.

19. The apparatus of claim 1, wherein said specimen holder is enclosed in said chamber.

* * * * *